(12) United States Patent
Presura et al.

(10) Patent No.: US 7,283,236 B2
(45) Date of Patent: Oct. 16, 2007

(54) ALIGNMENT SYSTEM AND LITHOGRAPHIC APPARATUS EQUIPPED WITH SUCH AN ALIGNMENT SYSTEM

(75) Inventors: Cristian Presura, Veldhoven (NL); Jan Evert Van Der Werf, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 481 days.

(21) Appl. No.: 10/882,683

(22) Filed: Jul. 2, 2004

(65) Prior Publication Data

US 2006/0001879 A1 Jan. 5, 2006

(51) Int. Cl.
*G01B 11/00* (2006.01)
*G03B 27/42* (2006.01)
*G03B 27/32* (2006.01)
*H01L 23/544* (2006.01)
*H01L 21/76* (2006.01)
*G03F 9/00* (2006.01)
*G03C 5/00* (2006.01)

(52) U.S. Cl. .......................... 356/401; 355/53; 355/77; 257/797; 438/401; 430/22; 430/30

(58) Field of Classification Search ..................... None
See application file for complete search history.

(56) References Cited

U.S. PATENT DOCUMENTS 6,995,831 B2* 2/2006 Levasier et al. .............. 355/53
7,002,667 B2* 2/2006 Levasier et al. .............. 355/69

* cited by examiner

*Primary Examiner*—Gregory J. Toatley, Jr.
*Assistant Examiner*—Gordon J. Stock, Jr.
(74) *Attorney, Agent, or Firm*—Pillsbury Winthrop Shaw Pittman LLP

(57) ABSTRACT

A marker structure on a substrate includes line elements and trench elements, the line elements and trench elements each having a length in a first direction and being arranged in an alternating repetitive sequence in a second direction perpendicular to the first direction, the alternating repetitive sequence having a sequence length, the marker structure having at least one pitch value, the at least one pitch value being the sum of a line width of one line element and a trench width of one trench element. A width of the line elements varies over the sequence length of the marker structure between a minimum line width value and a maximum line width value, while a width of the trench elements likewise varies over the sequence length of the marker structure between a minimum trench width value and a maximum trench width value. A duty cycle of a pair of a line element and an adjacent trench element is substantially constant over the sequence length of the marker structure. Thus, the pitch value varies from a minimum pitch value to a maximum pitch value over the sequence length.

16 Claims, 5 Drawing Sheets

PRIOR ART

*Fig 6*

PRIOR ART

ALIGNMENT SYSTEM AND LITHOGRAPHIC APPARATUS EQUIPPED WITH SUCH AN ALIGNMENT SYSTEM

BACKGROUND OF THE INVENTION

1. Field of the Invention

The present invention relates generally to systems for aligning objects and certain embodiments relate more particularly to lithographic apparatus equipped with such an alignment system.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Usually, a semiconductor device comprises microelectronic circuitry which is constructed of a plurality of patterned layers stacked on each other. Each patterned layer must have a certain alignment or overlay with the previous patterned layer(s) on which the layer is located. To obtain such a certain alignment, the lithographic apparatus comprises an alignment system which determines the positions of one or more markers on the semiconductor substrate. A marker is typically a grating. The alignment system according to the prior art uses a monochromatic light beam that is aimed at the grating. A diffraction pattern is generated by the interaction of light beam and grating, and from measurement on the diffraction orders in the diffraction pattern information is obtained relating to the position of the semiconductor substrate relative to a reference position. Then, upon exposure of the patterned layer the position of the target portion can be arranged such that a minimum alignment error occurs.

However, in practice the alignment procedure is hindered by a deformation of the alignment grating(s). An alignment grating may be deformed by the processes to create each patterned layer, especially the patterned layer directly on the grating. For example, a planarisation step of the layer directly on the grating by way of chemical mechanical polishing (CMP) may cause the lines and/or trenches of the grating to obtain an asymmetric form. The asymmetry of the lines and/or trenches influence the orders in the diffraction pattern, which may lead to an erroneous shift of the aligned position as calculated from the diffraction pattern.

From the prior art it is known that it is possible to reduce the possible error introduced by (a) deformed alignment marker(s) by using a broad-band radiation source for generating a diffraction pattern on such an alignment marker. Due to the plurality of wavelengths of the radiation source, a range of diffraction angles is generated for each diffraction order. By adapting both the wavelength range and the period of the alignment marker, it is possible to obtain a number of non-overlapping diffraction angle ranges. From measuring the signal for an angle range related to a particular order, an improved alignment can result due to out-averaging of singularities in the signal.

However, use of such a broad-band system may not be compatible for a lithographic apparatus in which the broad-band radiation must pass an optical path to reach the alignment marker. Typically, the radiation follows the optical path of the projection beam in the lithographic apparatus. In the optical path, a projection system of the lithographic apparatus is arranged to have an optimal imaging function for a specific wavelength (or a small band wavelength range). Other wavelengths may not pass the optical path as desired leading to a flawed radiation beam for diffraction. Moreover, a broad-band radiation may also cause undesired thermal effects in the optical path that affect the imaging quality of the lithographic apparatus.

SUMMARY OF THE INVENTION

One aspect of embodiments of the present invention provides an alignment system that provides a better quality of alignment when using possibly deformed alignment markers while using a radiation source with only a specific wavelength (or a small band wavelength range).

This is achieved by a marker structure on a substrate, the marker structure comprising a plurality of line elements and a plurality of trench elements, the line elements and trench elements each having a length in a first direction and being arranged in an alternating repetitive sequence in a second direction perpendicular to the first direction, the alternating repetitive sequence having a sequence length, the marker structure having at least one pitch value, the at least one pitch value being the sum of a line width of one line element and a trench width of one trench element, wherein the line width of one line element varies over the sequence length of the marker structure between a minimum line width value and a maximum line width value, the trench width of one trench element varies over the sequence length of the marker structure between a minimum trench width value and a maximum trench width value, a duty cycle of a pair of a line element and an adjacent trench element being substantially constant over the sequence length of the marker structure, thus forming a variation of the at least one pitch value from a minimum pitch value to a maximum pitch value over the sequence length.

According to a further aspect of the invention, there is provided an alignment system arranged for determining an alignment of a substrate, the semiconductor substrate comprising a marker structure, the marker structure comprising a plurality of line elements and a plurality of trench elements, the line elements and trench elements each having a length in a first direction and being arranged in an alternating repetitive sequence in a second direction perpendicular to the first direction, the alternating repetitive sequence having a sequence length, the marker structure having at least one pitch value, the at least one pitch value being the sum of a line width of one line element and a trench width of one trench element, the alignment system being arranged for illuminating the marker structure with an illumination beam and for generating a diffraction pattern comprising diffracted beams by way of the marker structure wherein the line width of one line element varies over the sequence length of the marker structure between a minimum line width value and a maximum line width value, the trench width of one trench element varies over the sequence length of the marker structure between a minimum trench width value and a maximum trench width value, a duty cycle of a pair of a line element and an adjacent trench element being substantially constant over the sequence length of the marker structure, thus forming a variation of the at least one pitch value from a minimum pitch value to a maximum pitch value over the sequence length, the diffraction pattern comprising at least a range of first order diffracted beams relating to the variation of the at least one pitch value between said minimum pitch value to said maximum pitch value, the alignment system being arranged to obtain alignment information from said at least range of the first order diffracted beams, the alignment information comprising an averaged alignment error.

According to a further aspect of the invention, there is provided a lithographic apparatus including an illumination system for providing a projection beam of radiation, a support structure for supporting a patterning device, the patterning device serving to impart the projection beam with a pattern in its cross-section, a substrate table for holding a substrate, and a projection system for projecting the patterned beam onto a target portion of the substrate, and an alignment system arranged for determining an alignment of a substrate, the semiconductor substrate comprising a marker structure, the marker structure comprising a plurality of line elements and a plurality of trench elements, the line elements and trench elements each having a length in a first direction and being arranged in an alternating repetitive sequence in a second direction perpendicular to the first direction, the alternating repetitive sequence having a sequence length, the marker structure having at least one pitch value, the at least one pitch value being the sum of a line width of one line element and a trench width of one trench element, the alignment system being arranged for illuminating the marker structure with an illumination beam and for generating a diffraction pattern comprising diffracted beams by way of the marker structure wherein the line width of one line element varies over the sequence length of the marker structure between a minimum line width value and a maximum line width value, the trench width of one trench element varies over the sequence length of the marker structure between a minimum trench width value and a maximum trench width value, a duty cycle of a pair of a line element and an adjacent trench element being substantially constant over the sequence length of the marker structure, thus forming a variation of the at least one pitch value from a minimum pitch value to a maximum pitch value over the sequence length, the diffraction pattern comprising at least a range of first order diffracted beams relating to the variation of the at least one pitch value between said minimum pitch value to said maximum pitch value, the alignment system being arranged to obtain alignment information from said at least range of the first order diffracted beams, the alignment information comprising an averaged alignment error.

According to a further aspect of the invention, there is provided a device manufacturing method including providing a substrate, providing a projection beam of radiation using an illumination system, using a patterning device to impart the projection beam with a pattern in its cross-section, and projecting the patterned beam of radiation onto a target portion of the substrate, wherein the pattern to be projected on the target portion comprises a pattern for defining a marker structure, the marker structure comprising a plurality of line elements and a plurality of trench elements, the line elements and trench elements each having a length in a first direction and being arranged in an alternating repetitive sequence in a second direction perpendicular to the first direction, the alternating repetitive sequence having a sequence length, the marker structure having at least one pitch value, the at least one pitch value being the sum of a line width of one line element and a trench width of one trench element, wherein the line width of one line element varies over the sequence length of the marker structure between a minimum line width value and a maximum line width value, the trench width of one trench element varies over the sequence length of the marker structure between a minimum trench width value and a maximum trench width value, a duty cycle of a pair of a line element and an adjacent trench element being substantially constant over the sequence length of the marker structure, thus forming a variation of the at least one pitch value from a minimum pitch value to a maximum pitch value over the sequence length.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bares the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments

Figure 1:
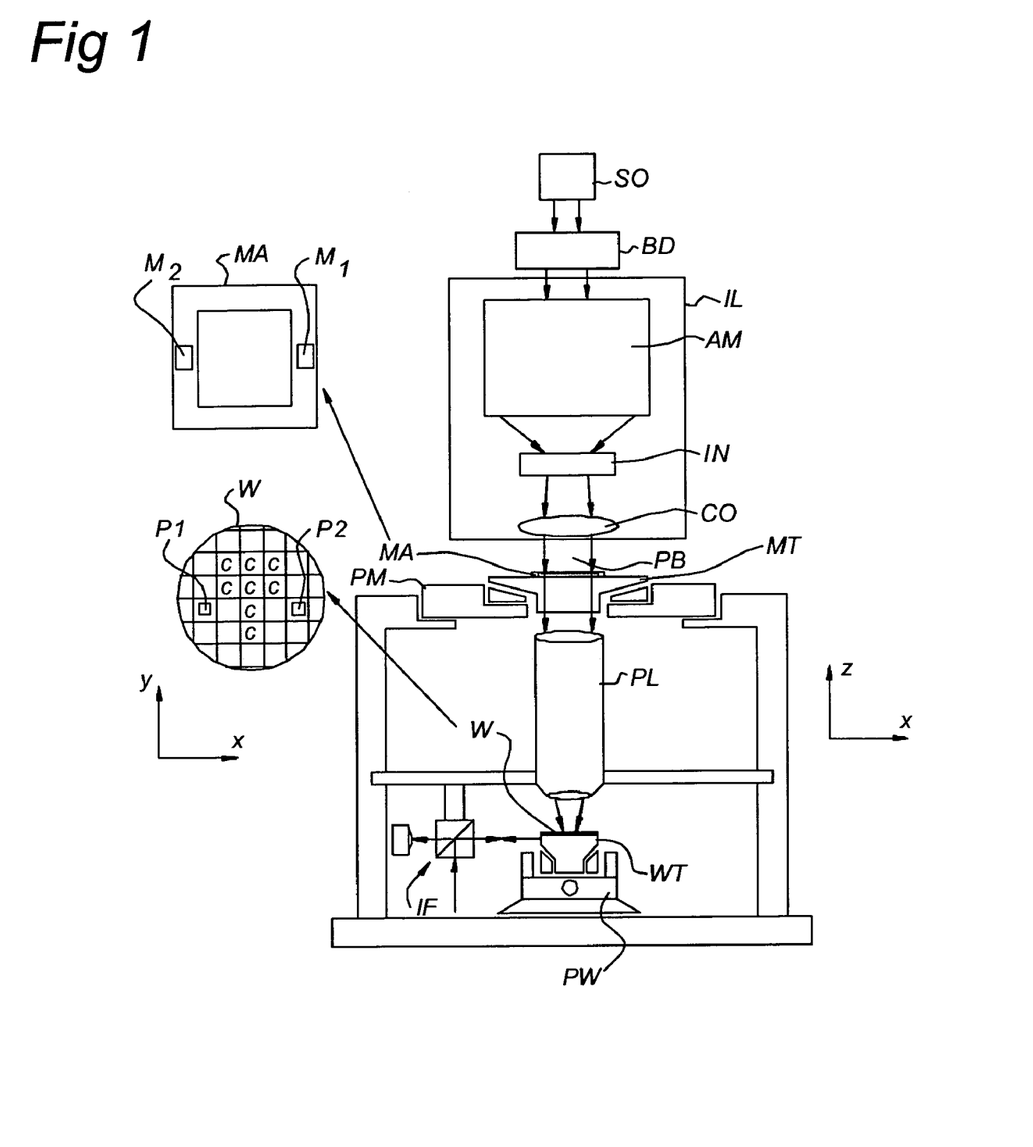
FIG. 1 depicts a lithographic apparatus according to an embodiment of the invention.

FIG. 1 schematically depicts a lithographic apparatus according to a particular embodiment of the invention. The apparatus comprises:.

an illumination system (illuminator) IL for providing a projection beam PB of radiation (e.g. UV radiation).

a first support structure (e.g. a mask table) MT for supporting patterning device (e.g. a mask) MA and connected to first positioner PM for accurately positioning the patterning device with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF. (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used, for example, in the following modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
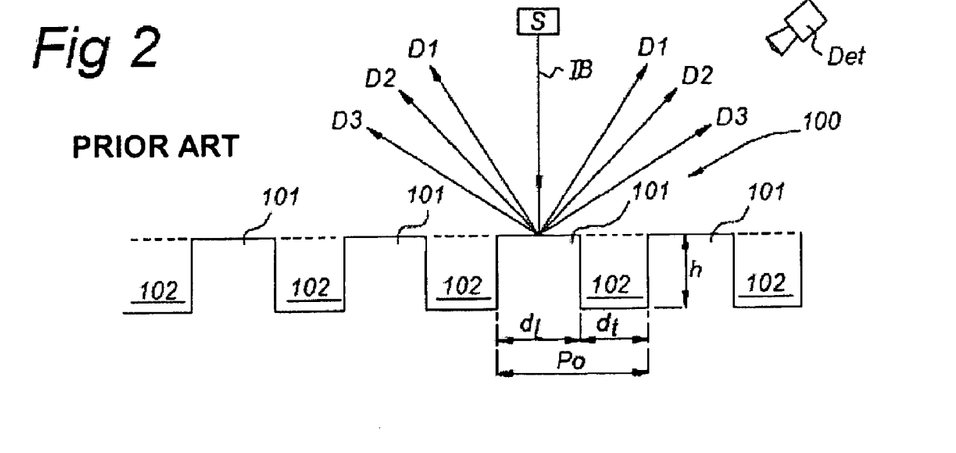
FIG. 2 depicts schematically a cross-section of an alignment marker according to the prior art.

FIG. 2 depicts schematically a cross-section of an alignment marker according to the prior art. The alignment marker 100 of the prior art is a phase depth grating and comprises a sequence of lines 101 and trenches 102 in a layer of substrate W, which is, for example, a semiconductor substrate. The lines 101 have a substantially rectangular shape with a constant height h and a constant line width $d_L$. The height h of the lines 101 is relative to the floor level of the trenches 102. The trenches 102 have a constant width $d_T$. The periodicity $P_0$ of the marker 100 equals the sum of the width $d_L$ of a line 101 and the width $d_T$ of a trench: $P_0 = d_L + d_T$.

The duty cycle DC of the alignment marker is defined here as the ratio of the line width over the trench width: $DC = d_L/d_T$.

During illumination of the alignment marker 100 by an illumination beam IB, a diffraction pattern is generated due to the interaction of the beam IB and the periodic structure of the alignment marker 100. The illumination beam IB is generated by a radiation source S, which may be identical to the radiation source SO as shown in FIG. 1. The beam IB is monochromatic or has a small-band range, with (main) wavelength $\lambda_0$. In FIG. 2 this is schematically illustrated: an illumination beam IB impinges under a substantially perpendicular angle on the alignment marker 100. The diffraction pattern generated comprises a plurality of diffracted beams D1, D2, D3, . . . , in increasing order. The diffraction angle of each diffracted beam is related to the wavelength $\lambda_0$ of the illumination beam IB, the periodicity of the alignment marker 100, and the order of the diffracted beam in a manner well known to the persons skilled in the art.

Schematically, a detector Det for detecting one or more of the diffraction orders D1, D2, D3, . . . is shown in FIG. 2. The detector Det is connected to a device (not shown) for receiving and, in certain embodiments, processing the signal from the detector Det.

Figure 3:
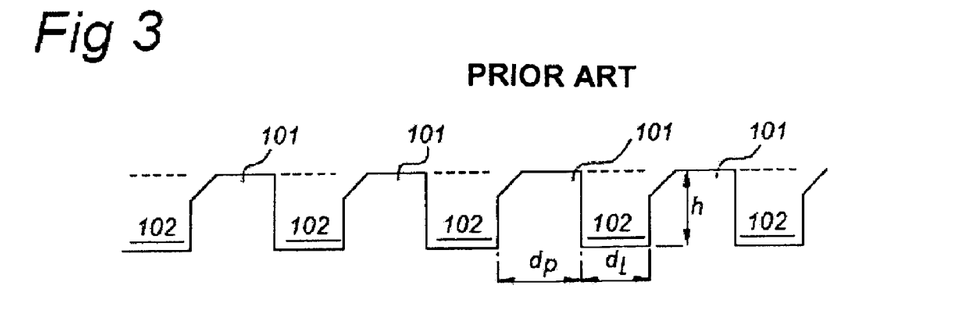
FIG. 3 depicts schematically a cross-section of a deformed alignment marker according to the prior art.

FIG. 3 depicts schematically a cross-section of a deformed alignment marker according to the prior art. During semiconductor device fabrication, a sequence of processing steps is carried out to create microelectronic circuitry basically by stacking a plurality of patterned layers on each other. To maintain a reasonable overall flatness of the surface, at some stages a planarising step may be carried out. Such a step may comprise a chemical-mechanical polishing (CMP) process. Typically, the alignment marker 100 of the prior art may be deformed by the CMP process. In FIG. 3 a cross-section is shown of a deformed alignment marker, which is deformed by a polishing step. Due to the polishing step an asymmetric abrasion has occurred on the top region of each line 101 of the alignment marker 100. In FIG. 3 all abrasions have been taken constant and similar for each marker line 101. It is noted that in practice, the severity of the deformation of the individual lines may vary.

Due to the deformation of the alignment marker, a diffraction pattern generated on it by the illumination beam IB will obviously deviate from the diffraction pattern generated on the undeformed alignment marker as discussed with reference to FIG. 2.

Due to the deviation of the diffraction pattern, the alignment procedure which attempts to obtain an aligned position of the substrate relative to a reference, will be affected to the extent that the aligned position as determined by the alignment procedure may in fact show a dislocation from the true aligned position. Thus, alignment on a deformed alignment marker may cause an alignment error for a patterned layer stacked on a preceding one, although the alignment appears to be correct. This will be further explained with reference to FIG. 4.

Figure 4:
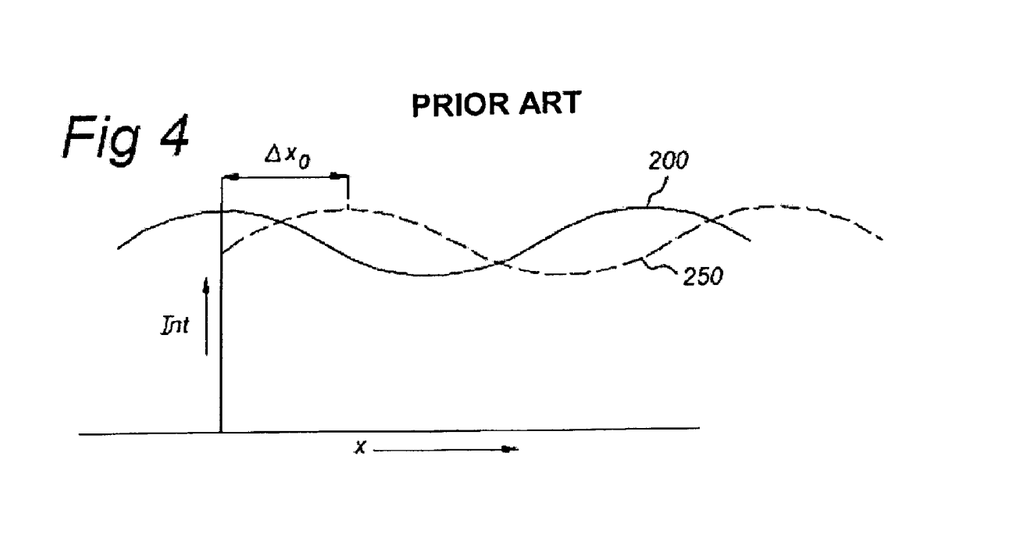
FIG. 4 shows a plot of measured order intensity as a function of marker position relative to the radiation beam for an alignment marker according to the prior art.

FIG. 4 shows a schematic plot of measured order intensity as a function of marker position relative to the radiation beam for an alignment marker according to the prior art.

The alignment system is arranged to measure, after a pre-alignment step, a deviation of the position of the alignment marker within basically the periodicity of the marker. In the prior art, for an alignment marker with a 16/n μm periodicity, the alignment procedure can provide an adjustment of 8 μm (using n=1).

In FIG. 4 the measured intensity of a single diffraction order (e.g., D1) is plotted as a function of the marker position x relative to the illumination beam (e.g., its center). For an undeformed alignment marker the measured intensity is indicated by the solid line 200. The measured intensity 200 varies (quasi) periodically with the x position. By adjusting the position of the marker (by relatively moving the substrate) to obtain a maximum measured intensity, the aligned position of the substrate is reached.

For a deformed alignment marker structure the measured intensity of a single diffraction order as a function of the marker position x varies with the position x as indicated by dotted line 250 (i.e., for the same diffraction order as shown by line 200 for an undeformed alignment marker). Due to the imperfection of the alignment marker the periodic function has shifted relatively to the unaffected alignment marker structure shown by line 200. This shift is the alignment error due to damage of the marker and is indicated by $\Delta x_0$ (for wavelength $\lambda_0$).

In the case of a deformed alignment marker structure adjustment of the x position by adjusting the x position in such a way as to obtain an intensity maximum may apparently lead to an aligned position of the marker, but still the apparently aligned position is shifted by at least the alignment error $\Delta x_0$. In summary, alignment by a deformed alignment marker structure will lead to an inaccurate aligned position when using the alignment procedure from the prior art.

Note that for a (quasi) periodic function as shown in FIG. 4, the direction for adjustment of the x position could be either in a direction of a smaller x value or in a direction of a larger x value (irrespective if the alignment marker is deformed or not). In practice, the adjustment will be in the correct direction by some measures which are not relevant for the present invention and will therefore not be discussed here.

Further, the overall alignment is not limited to a single direction x but can also be carried out in an orthogonal direction (relative to x) by the provision of (an) alignment marker(s) in that orthogonal direction.

Figure 5:
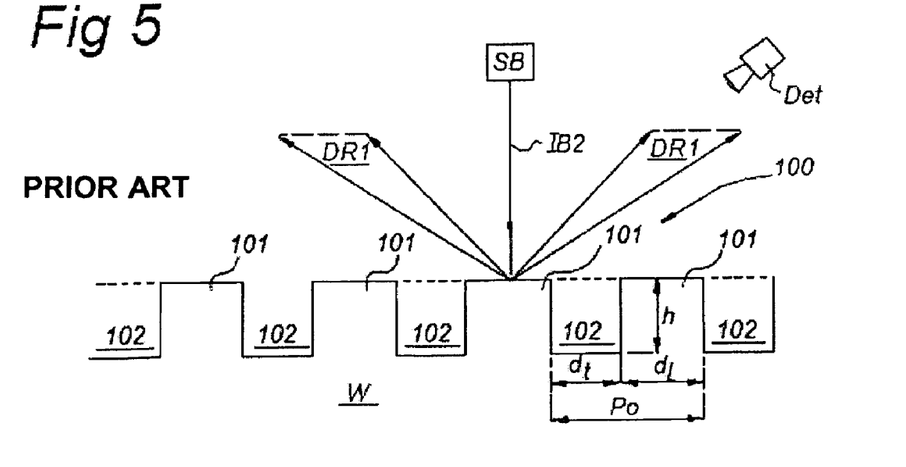
FIG. 5 depicts schematically a cross-section of the alignment marker according to the prior art, being exposed to a broad-band radiation source for generating diffraction.

FIG. 5 depicts schematically a cross-section of the alignment marker according to the prior art, being exposed to a broad-band radiation source for generating diffraction.

In FIG. 5 the same reference numbers are used for similar entities as shown in the preceding figures.

During an alignment procedure, a broad-band illumination beam 1132 is used for generating a diffraction pattern on the alignment marker structure 100 as shown in FIG. 2. Broad-band illumination beam 1132 generated by a broad band radiation source SB comprises a spectral range of wavelengths which generates at least a broadband diffraction range DR1 of first diffraction orders. Optionally, also one or more ranges of higher diffraction orders may be generated.

Broadband diffraction range DR1 of first order diffraction orders is defined as the angular interval containing each first diffraction order for each wavelength from 1132. The range of wavelengths of the broad-band illumination beam IB2 is chosen in such a way that no overlap between the broadband diffraction range DR1 and an optional range of higher diffraction orders occurs.

Figure 6:
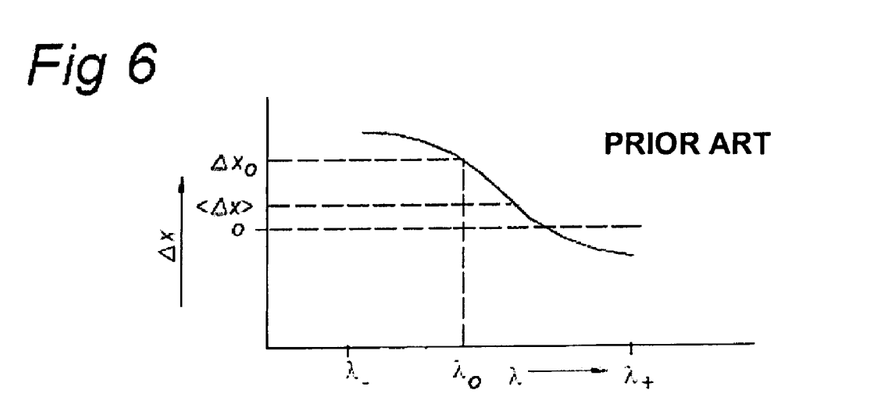
FIG. 6 shows a plot of an alignment error as a function of wavelength for an alignment marker according to the prior art, when using a broad-band radiation source for generating diffraction.

FIG. 6 shows a plot of an alignment error $\Delta x$ as a function of wavelength for an alignment marker according to the prior art, when using a broad-band radiation source for generating diffraction.

Again, for each individual wavelength of the broad-band illumination beam IB2, an alignment error $\Delta x$ will be generated by a deformed alignment marker structure. The broadband illumination beam IB2 comprises a wavelength range from a minimum wavelength $\lambda-$ to a maximum wavelength $\lambda+$.

The alignment error $\Delta x_0$ will vary as a function of the wavelength $\lambda_0$, for example, as shown in FIG. 6 from a positive value of $\Delta x$ for the minimum wavelength $\lambda-$ to a negative value of $\Delta x$ for the maximum wavelength $\lambda+$.

The alignment error $\Delta x_0$ for wavelength $\lambda_0$ is depicted as well.

It is noted that the relation of alignment error $\Delta x$ and the wavelength $\lambda$ is only exemplary and may be reversed as well: i.e., varying from a negative value of $\Delta x$ for the minimum wavelength $\lambda-$ to a positive value of $\Delta x$ for the maximum wavelength $\lambda+$.

The effect of performing the alignment procedure as sketched with reference to FIG. 4 with a broad-band illumination beam IB2 is that the overall alignment error, i.e., the average alignment error $<\Delta x>$ over the wavelength range $\lambda-$ to $\lambda+$ is smaller than the alignment error $\Delta x_0$ for the single wavelength $\lambda_0$.

Figure 7:
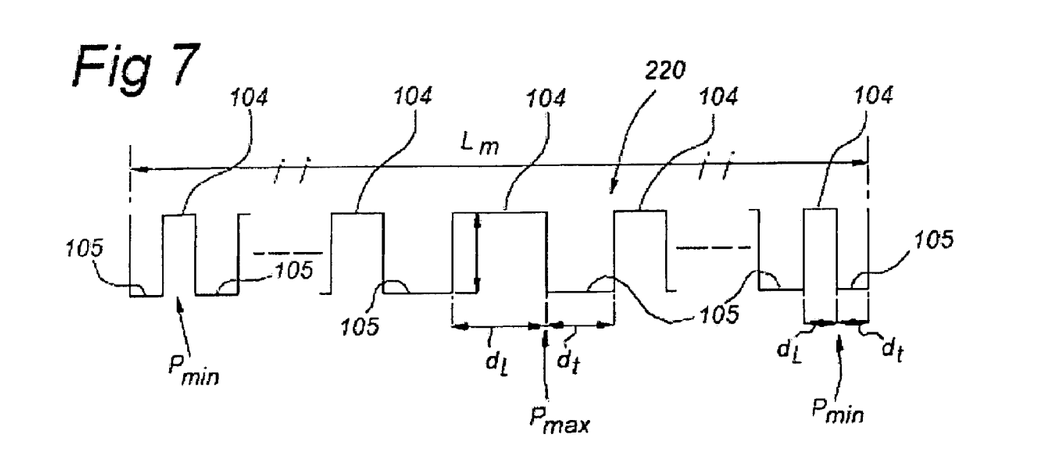
FIG. 7 depicts a cross-section of an alignment marker according to the present invention.

FIG. 7 depicts a cross-section of an alignment marker 220 according to the present invention.

The alignment marker structure according to the present invention is a phase depth grating which has a variable grating pitch. The alignment marker 220 comprises a sequence of lines 104 and trenches 105 in a layer of the substrate W. The grating has a width $L_M$. Over the width $L_M$, the pitch of the grating (i.e., the width of a single line 104 and a single trench 105) varies from a minimum pitch value $P_{min}$ to a maximum pitch value $P_{max}$. The duty cycle DC for each pair of a line 104 and a trench 105 is however kept constant. Thus, the minimum pitch value $P_{min}$ equals the sum of a minimum line width $d_{L,min}$ and a minimum trench width $d_{T,min}$, and the maximum pitch value $P_{max}$ equals the sum of a maximum line width $d_{L,max}$ and a maximum trench width $d_{T,max}$.

Also, the height h of the lines 104 is kept constant.

In FIG. 7 one embodiment of the alignment marker 220 according to the present invention is shown, wherein the pitch varies from the minimum pitch value $P_{min}$ at one end of the grating to the maximum pitch value $P_{max}$ in the center of the grating to again the minimum pitch value $P_{min}$ at the other end of the grating.

Figure 8:
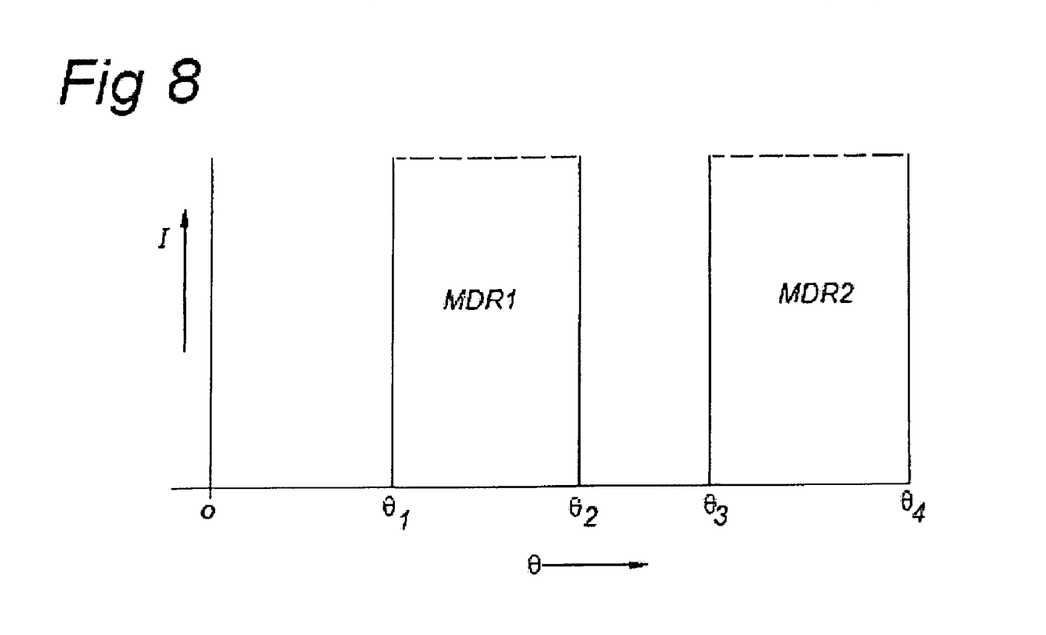
FIG. 8 depicts a diffraction pattern generated on the alignment marker according to the present invention by a monochromatic or small-band radiation beam.

FIG. 8 depicts an intensity profile I of a diffraction pattern generated by the alignment marker according to the present invention by a monochromatic or small-band illumination beam.

Illumination of the alignment marker 220 according to the present invention by a monochromatic or small-band illumination beam IB causes the generation of a diffraction pattern similar to that as generated on a constant pitch grating by a broad-band illumination beam. A small-band illumination beam can be considered as a substantially monochromatic beam for the purpose of the present invention: the broadening of diffraction orders due to the bandwidth of such a small-band beam is negligible in comparison to other broadening effects, such as by a detector that measures the diffraction order.

The intensity profile of the pattern shows only schematically the intensity bands which relate to a range MDR1 of the first diffraction orders between $\theta_1$ and $\theta_2$, and a subsequent range MDR2 of the second diffraction orders between $\theta_3$ and $\theta_4$. The values $\theta_1$, $\theta_2$, $\theta_3$ and $\theta_4$ indicate diffraction angles, i.e., the angle between incoming beam IB and a diffracted beam. The actual shape of the intensity profile and the intensity distribution within each diffraction order range MDR1, MDR2 are not discussed here.

During an alignment procedure, a monochromatic or small-band illumination beam IB generates a diffraction pattern on the alignment marker structure 220 as shown in FIG. 5 since the grating pitch varies, at least a diffraction range MDR1 of first diffraction orders is generated by the interaction of the beam IB and the marker structure.

Diffraction range MDR1 of first order diffraction orders is defined as the angular interval [$\theta_1$, $\theta_2$]. containing each first diffraction order for each pitch generated by the beam IB.

Optionally, one or more diffraction ranges of a higher diffraction order may be generated as well, such as subsequent range MDR2 of second diffraction orders shown in FIG. 8, provided the ratio of the pitch range [$P_{min}$, $P_{max}$] and the used wavelength of the illumination beam IB satisfies the diffraction criterion for a higher diffraction order.

For a wavelength $\lambda$=632 nm (He—Ne laser) and a pitch range of 0.8 μm-1.4 μm, the diffraction range MDR1 of first diffraction orders is within 26 and 52 degrees. The diffraction range MDR2 for second orders of diffraction starts at approx. 64 degrees. No overlap between the first and second diffraction orders occurs in this case.

Note that in an alignment system within a lithographic apparatus, the illumination beam IB of the alignment system may be identical to the radiation beam of the lithographic apparatus.

Further, it is noted that the detector for measuring the diffraction range(s) may need to be adapted due to the fact that light diffracted by the marker structure must be added coherently by the detector. It is noted that, although it may be assumed that the amplitude for each beam under a given angle in the diffraction range has a constant amplitude, a coherent summation may not provide a constant amplitude shape, because of phase differences between these beams. In that case, it may be required to change from a single detector to multiple detectors arranged over the detection range. Such multiple detectors may be embodied by an integrated imaging device comprising a plurality of light detectors such as for example a CCD- or CMOS-imager. Other arrangements of multiple detectors are conceivable as will be appreciated by persons skilled in the art.

Figure 9:
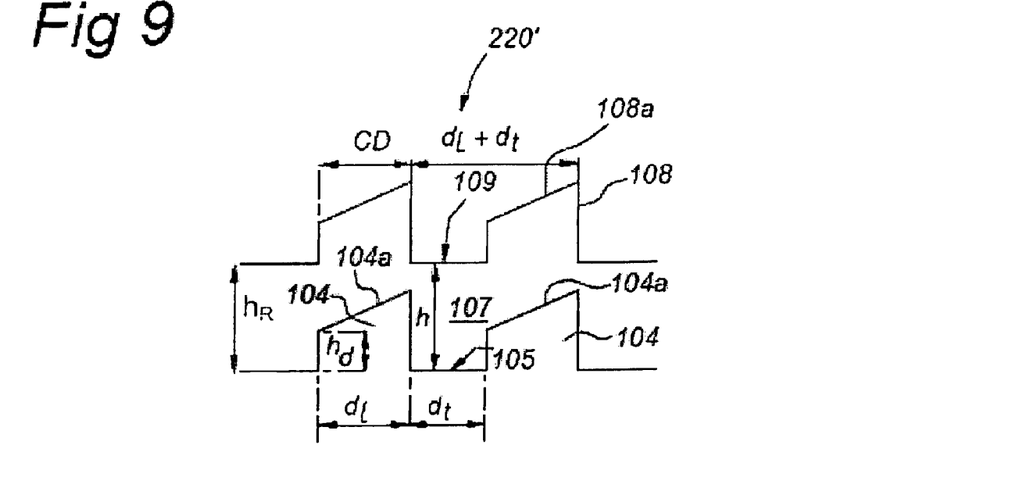
FIG. 9 depicts a portion of a cross-section of a modeled deformed alignment marker according to the present invention.

The determination for the overall alignment error <$\Delta x$> will now be discussed with reference to a modeled deformed alignment marker in accordance with the present invention.

FIG. 9 depicts a portion of a cross-section of a modeled deformed alignment marker 220' according to the present invention.

To obtain an estimate for the alignment error as a function of the grating pitch, the geometry of the alignment marker according to the present invention is modeled, and the alignment error is calculated as a function of the grating's pitch for a series of resist layers each with a different thickness, that are covering the grating.

The modeled alignment marker comprises a series of lines 104 and trenches 105 as shown in FIG. 7. The width of the line ($d_L$) and the trench ($d_T$) vary across the width $L_M$ of the grating structure as explained with reference to FIG. 7.

Due to steps in the manufacturing process, the lines 104 of the grating have become deformed (cf. FIG. 9). The top surface 104a is slanted relative to the level of the substrate W wherein the grating was formed. The line 104 is assumed to have a height h on its undeformed side. On the deformed side, the height of the line is indicated by $h_d$, wherein $h_d$<h.

On top of the deformed grating a resist layer 107 was deposited. The resist layer 107 has a thickness $h_R$. Further, the resist layer 107 is substantially conformal with the grating: the resist layer also shows lines 108 and trenches 109, with equal dimensions as the grating's lines and trenches below, and with the same slanted top surface 108a of the lines.

The width of the resist line 108 is assumed as the critical dimension CD (=$d_L$) in the structure. The (local) pitch is equal to the sum of the line width and trench width ($d_L$+$d_T$).

In the model the grating pitch varies from 0.8 μm to 1.4 μm (cf. FIG. 7), the height of the grating lines is h=100 nm, and the deformation of the top surface 104a, 108a of the grating line and resist line is 25 nm, thus $h_d$=75 nm. the height of the resist lines is equal to the height of the grating lines: h=100 nm. Further, the wavelength of the illumination beam IB is $\lambda$=632 nm.

The resist thickness is taken as $h_R$=0.8, 1.0, 1.2 or 1.4 μm.

Figure 10:
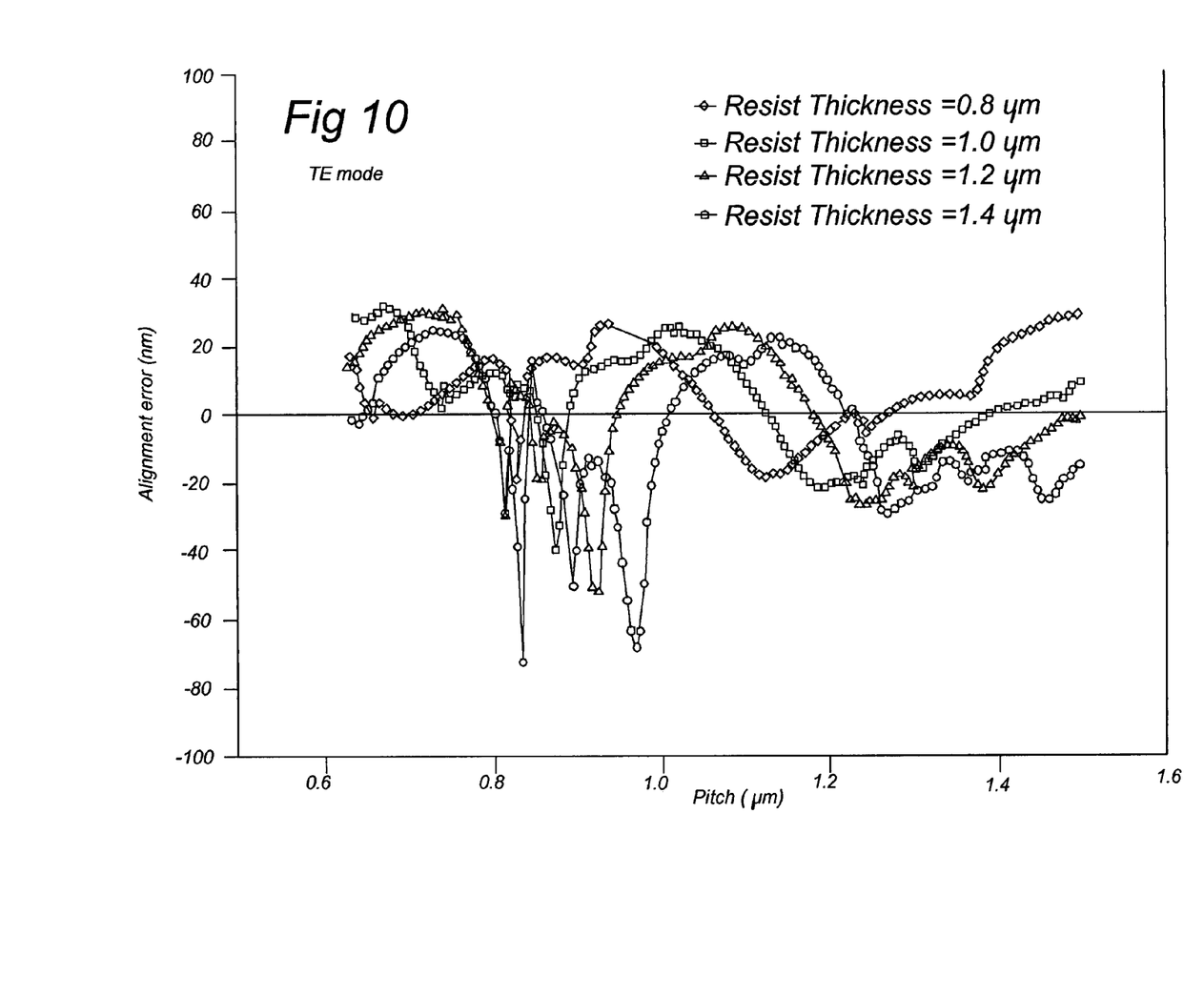
FIG. 10 shows a plot of an alignment error as a function of the grating pitch for an alignment marker.

FIG. 10 shows a plot of calculated alignment error as a function of the grating pitch for a modeled alignment marker 220' according to the present invention, the marker being covered by a resist layer.

The alignment error $\Delta x$ (on vertical axis) is plotted as a function of the pitch ($d_L$+$d_T$) for a series of different resist thickness values ($h_R$=0.8, 1.0, 1.2 or 1.4 μm). For each of these resist thickness values, the alignment error shows a course which at low pitch values comprises predominantly positive error values. Then, a sharp change of the alignment error occurs to a negative error value between pitch values from about 0.8 to about 1.0 μm. The width of this interval with negative alignment error values appears to vary depending on the precise values of pitch and $h_R$. Next, the alignment error becomes positive again for higher pitch values until again the alignment error value becomes negative again. At relative high pitch values the alignment error seems to become positive again.

By using information from the complete alignment marker pitch range during the alignment procedure (for a given resist thickness) the overall alignment error for this procedure is in a sense the average of the alignment error over the pitch range.

In comparison to an alignment error $\Delta x_0$ for a grating with a single pitch $P_0$ over its full width $L_M$, the average alignment error <$\Delta x$> over a pitch range will, in general, be smaller, as can be observed in this figure (for an equal resist thickness).

It will be apparent to the person skilled in the art that other embodiments of the invention can be conceived and reduced to practice without departing form the true spirit of the invention, the scope of the invention being limited only by the appended claims as finally granted. The description is not intended to limit the invention.

What is claimed is:

1. A marker structure on a substrate, comprising:
   a plurality of line elements; and
   a plurality of trench elements;
   wherein the line elements and trench elements each have a length in a first direction and are arranged in an alternating repetitive sequence in a second direction perpendicular to the first direction, the alternating repetitive sequence having a sequence length, the marker structure having at least one pitch value, the at least one pitch value being the sum of a line width of one line element and a trench width of one trench element, and
   wherein (i) respective ones of the plurality of line elements have differing widths such that the plurality of line elements has a minimum line width value, a maximum line width value, and at least one intermediate line width value that is greater than the minimum line width value and less than the maximum line width value, (ii) respective ones of the plurality of trench elements have differing widths such that the plurality of trench elements has a minimum trench width value, a maximum trench width value, and at least one intermediate trench width value that is greater than the minimum trench width value and less than the maximum trench width value, and (iii) a duty cycle of respective pairs of lines and trenches being substantially constant over the sequence length of the marker structure such that there is a variation of the at least one pitch value from a minimum pitch value to a maximum pitch value over the sequence length.

2. Marker structure according to claim 1, wherein
at a first end of the marker structure and at a second end of the marker structure, the at least one pitch value substantially equals the minimum pitch value, and
between the first and second ends of the marker structure, the at least one pitch value substantially equals the maximum pitch values.

3. Marker structure according to claim 2, wherein the at least one pitch value that substantially equals the maximum pitch value is proximate a center of the marker structure.

4. A marker structure on a substrate, comprising:
a plurality of line elements; and
a plurality of trench elements;
wherein the line elements and trench elements each have a length in a first direction and are arranged in an alternating repetitive sequence in a second direction perpendicular to the first direction, the alternating repetitive sequence having a sequence length, the marker structure having (i) a variable pitch value that varies over the sequence length between a minimum pitch value and a maximum pitch value and includes one or more intermediate pitch values that are greater than the minimum pitch value and less than the maximum pitch value, and (ii) a duty cycle that is substantially constant over the sequence length.

5. Marker structure according to claim 4, wherein
at a first end of the marker structure and at a second end of the marker structure, the at least one pitch value substantially equals the minimum pitch value, and
between the first and second ends of the marker structure, the at least one pitch value substantially equals the maximum pitch value.

6. Marker structure according to claim 5, wherein the at least one pitch value that substantially equals the maximum pitch value is proximate a center of the marker structure.

7. An alignment system arranged for determining an alignment of a substrate, comprising:
optical elements configured to guide an alignment beam of radiation to an alignment marker structure on the substrate;
a detector configured to detect a diffraction pattern produced by diffraction of the alignment beam of radiation by the alignment marker structure,
wherein the marker structure comprises a plurality of line elements and a plurality of trench elements, the line elements and trench elements each having a length in a first direction and being arranged in an alternating repetitive sequence in a second direction perpendicular to the first direction, the alternating repetitive sequence having a sequence length, the marker structure having at least one pitch value, the at least one pitch value being the sum of a line width of one line element and a trench width of an adjacent trench element, and
wherein respective ones of the plurality of line elements have differing widths such that the plurality of line elements has a minimum line width value and a maximum line width value, respective ones of the plurality of trench elements have differing widths such that the plurality of trench elements has a minimum trench width value and a maximum trench width value, a duty cycle of respective pairs of lines and trenches being substantially constant over the sequence length of the marker structure such that there is a variation of the at least one pitch value from a minimum pitch value to a maximum pitch value over the sequence length,
the diffraction pattern comprising at least a range of first order diffracted beams relating to the variation of the at least one pitch value between said minimum pitch value to said maximum pitch value; and
a processor, configured to determine alignment information from the diffraction pattern.

8. An alignment system as in claim 7 wherein the alignment information comprises averaged alignment error.

9. Alignment system according to claim 7, wherein
at a first end of the marker structure and at a second end of the marker structure, the at least one pitch value substantially equals the minimum pitch value, and
between the first and second ends of the marker structure, the at least one pitch value substantially equals the maximum pitch value.

10. Alignment system according to claim 9, wherein the at least one pitch value that substantially equals the maximum pitch value is proximate a center of the marker structure.

11. A lithographic apparatus comprising:
an illumination system configured to condition a beam of radiation;
a support structure configured to support a patterning device, the patterning device configured to impart the beam with a pattern in its cross-section;
a substrate table configured to hold a substrate;
a projection system configured to project the patterned beam onto a target portion of the substrate; and
an alignment system configured to determine an alignment of the substrate, the alignment system comprising:
a detector configured to detect a diffraction pattern produced by diffraction of an alignment beam of radiation by an alignment marker on the substrate,
wherein the marker comprises a plurality of line elements and a plurality of trench elements, the line elements and trench elements each having a length in a first direction and being arranged in an alternating repetitive sequence in a second direction perpendicular to the first direction, the alternating repetitive sequence having a sequence length, the marker having at least one pitch value, the at least one pitch value being the sum of a line width of one line element and a trench width of an adjacent trench element, and
wherein respective ones of the plurality of line elements have differing widths such that the plurality of line elements has a minimum line width value and a maximum line width value, respective ones of the plurality of trench elements have differing widths such that the plurality of trench elements has a minimum trench width value and a maximum trench width value, a duty cycle of respective pairs of lines and trenches being substantially constant over the sequence length of the marker such that there is a variation of the at least one pitch value from a minimum pitch value to a maximum pitch value over the sequence length,
the diffraction pattern comprising at least a range of first order diffracted beams relating to the variation of the at least one pitch value between said minimum pitch value to said maximum pitch value; and
a processor, configured to determine alignment information from the diffraction pattern.

12. Lithographic apparatus according to claim 11, wherein
at a first end of the marker and at a second end of the marker, the at least one pitch value substantially equals the minimum pitch value, and
between the first and second ends of the marker, the at least one pitch value substantially equals the maximum pitch value.

13. Lithographic apparatus according to claim 12, wherein the at least one pitch value that substantially equals the maximum pitch value is proximate a center of the marker.

14. A device manufacturing method comprising:
providing a beam of radiation;
using a patterning device to impart the beam with a pattern in its cross-section; and
projecting the patterned beam of radiation onto a target portion of the substrate,
wherein the pattern to be projected on the target portion comprises a pattern for defining a marker structure, the marker structure comprising a plurality of line elements and a plurality of trench elements, the line elements and trench elements each having a length in a first direction and arranged in an alternating repetitive sequence in a second direction perpendicular to the first direction, the alternating repetitive sequence having a sequence length, the marker structure having (i) a variable pitch value that varies over the sequence length between a minimum pitch value and a maximum pitch value and includes one or more intermediate pitch values that are greater than the minimum pitch value and less than the maximum pitch value, and (ii) a duty cycle that is substantially constant over the sequence length.

15. Device manufacturing method according to claim 14, wherein
at a first end of the marker structure and at a second end of the marker structure, the at least one pitch value substantially equals the minimum pitch value, and
between the first and second ends of the marker structure, the at least one pitch value substantially equals the maximum pitch value.

16. Device manufacturing method according to claim 15, wherein the at least one pitch value that substantially equals the maximum pitch value is proximate a center of the marker structure.

* * * * *